(12) United States Patent
Grimbergen

(10) Patent No.: US 9,142,467 B2
(45) Date of Patent: Sep. 22, 2015

(54) ETCH RATE DETECTION FOR ANTI-REFLECTIVE COATING LAYER AND ABSORBER LAYER ETCHING

(71) Applicant: Applied Materials, Inc., Santa Clara, CA (US)

(72) Inventor: Michael Grimbergen, Redwood City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/558,422

(22) Filed: Dec. 2, 2014

(65) Prior Publication Data

US 2015/0111315 A1    Apr. 23, 2015

Related U.S. Application Data

(62) Division of application No. 13/543,222, filed on Jul. 6, 2012, now Pat. No. 8,900,469.

(60) Provisional application No. 61/577,318, filed on Dec. 19, 2011.

(51) Int. Cl.
G01L 21/30 (2006.01)
H01L 21/66 (2006.01)
H01J 37/32 (2006.01)
H01L 21/3213 (2006.01)

(52) U.S. Cl.
CPC ........... *H01L 22/26* (2013.01); *H01J 37/32963* (2013.01); *H01J 37/32972* (2013.01); *H01L 21/32136* (2013.01); *H01L 22/12* (2013.01)

(58) Field of Classification Search
None
See application file for complete search history.

(56) References Cited

U.S. PATENT DOCUMENTS

2008/0070128 A1* 3/2008 Wu et al. ............................ 430/5

FOREIGN PATENT DOCUMENTS

EP    1926125 A1 * 5/2008

* cited by examiner

*Primary Examiner* — Binh X Tran
*Assistant Examiner* — David Cathey, Jr
(74) *Attorney, Agent, or Firm* — Patterson & Sheridan, LLP

(57) ABSTRACT

A method and apparatus for etching a photomask substrate with enhanced process monitoring is provided. In one embodiment, a method of determining an etching endpoint includes performing an etching process on a first tantalum containing layer through a patterned mask layer, directing a radiation source having a first wavelength from about 200 nm and about 800 nm to an area uncovered by the patterned mask layer, collecting an optical signal reflected from the area covered by the patterned mask layer, analyzing a waveform obtained the reflected optical signal reflected from the substrate from a first time point to a second time point, and determining a first endpoint of the etching process when a slope of the waveform is changed about 5 percent from the first time point to the second time point.

7 Claims, 4 Drawing Sheets

ETCH RATE DETECTION FOR ANTI-REFLECTIVE COATING LAYER AND ABSORBER LAYER ETCHING

CROSS-REFERENCE TO RELATED APPLICATIONS

This application is a divisional of U.S. application Ser. No. 13/543,222, filed Jul. 6, 2012, now issued U.S Pat. No. 8,900,469, which claims benefit of U.S. Provisional Application Ser. No. 61/577,318 filed Dec. 19, 2011, both of which are incorporated by reference in their entireties.

BACKGROUND OF THE INVENTION

1. Field of the Invention

Embodiments of the present invention generally relate to the fabrication of integrated circuits and to the fabrication of photomasks useful in the manufacture of integrated circuits.

2. Description of the Related Art

In the manufacture of integrated circuits (IC), or chips, patterns representing different layers of the chip are created by a chip designer. A series of reusable masks, or photomasks, are created from these patterns in order to transfer the design of each chip layer onto a semiconductor substrate during the manufacturing process. Mask pattern generation systems use precision lasers or electron beams to image the design of each layer of the chip onto a respective mask. The masks are then used much like photographic negatives to transfer the circuit patterns for each layer onto a semiconductor substrate. These layers are built up using a sequence of processes and translate into the tiny transistors and electrical circuits that comprise each completed chip. Thus, any defects in the mask may be transferred to the chip, potentially adversely affecting performance. Defects that are severe enough may render the mask completely useless. Typically, a set of 15 to 30 masks is used to construct a chip and can be used repeatedly.

The next generation photomask as further discussed below is formed on a low thermal expansion glass or a quartz substrate having a multilayer film stack disposed thereon. The multilayer film stack may include an anti-reflective coating layer, an absorber layer, a capping layer, and a reflective multi-material layer. When manufacturing the photomask, a photoresist layer is disposed on the film stack to facilitate transferring features into the film stack during the subsequent patterning processes. During the patterning process, the circuit design is written onto the photomask by exposing portions of the photoresist to extreme ultraviolet light or ultraviolet light, making the exposed portions soluble in a developing solution. The soluble portion of the resist is then removed, allowing the underlying film stack exposed through the remaining photoresist be etched. The etch process removes the film stack from the photomask at locations where the resist was removed, i.e., the exposed film stack is removed.

With the shrink of critical dimensions (CD), present optical lithography is approaching a technological limit at the 45 nanometer (nm) technology node. Next generation lithography (NGL) is expected to replace the conventional optical lithography method, for example, in the 32 nm technology node and beyond. There are several NGL candidates, such as extreme ultraviolet (EUV) lithography (EUVL), electron projection lithography (EPL), ion projection lithography (IPL), nano-imprint, and X-ray lithography. Among these, EUVL is the most likely successor due to the fact that EUVL has most of the properties of optical lithography, which is a more mature technology as compared with other NGL methods.

Accordingly, the film stack is being developed to have a new film scheme so as to work with the EUV technology to facilitate forming the photomask with desired features disposed thereon. The film stack may include multiple layers with different new materials to be etched to form the desired features. Imprecise etch process and etch endpoint control may result in critical dimension (CD) bias, poor critical dimension (CD) uniformity, undesired cross sectional profile and etch critical dimension (CD) linearity and unwanted defects. It is believed that EUV technology may provide good CD uniformity, less etching bias, desired linearity, less line edge roughness, and high thickness uniformity and less defectivity.

As the new developed film stack described above includes an anti-reflective coating layer, an absorber layer, a capping and a reflective multi-material layer, obtaining precise etching endpoint for each of the layers being etched is becoming more and more difficult. Inaccurate etch endpoint control will often result in etch bias which may result in accurate transfer of the patterns to the film stack with desired critical dimension less than about 5 µm, such as about 50 nm to about 500 nm. This results in non-uniformity of the etched features of the photomask and correspondingly diminishes the ability to produce features for devices having small critical dimensions using the photomask. As the critical dimensions of photomask continue to shrink, the importance of accurate etching endpoint control increases. Thus, an accurate etching process endpoint control to the film stack disposed on the photomask for EUV technology is highly desirable.

Therefore, there is an ongoing need for improved etching endpoint process control in photomask fabrication, including improved apparatus and methods for collecting etch rate data and determining process endpoints.

SUMMARY OF THE INVENTION

The present invention provides a method and apparatus for etching a photomask substrate with enhanced process monitoring, for example, by providing for optical monitoring at certain regions of the photomask to obtain desired etch rate or thickness loss. In one embodiment, a method of determining an etching endpoint of a tantalum containing layer disposed on a substrate during an etching process includes performing an etching process on a first tantalum containing layer disposed on a first surface of a substrate through a patterned mask layer in a plasma etch chamber, directing radiation having a first wavelength from about 200 nm and about 800 nm to an area of the first tantalum containing layer uncovered by the patterned mask layer during the etching process, collecting an optical signal reflected from the area uncovered by the patterned mask layer, analyzing a waveform obtained from the reflected optical signal, and determining a first endpoint of the etching process when a slope of the waveform change by about 5 percent or greater.

In another embodiment, a method of determining an etching endpoint of a tantalum containing layer disposed on a substrate during an etching process includes performing an etching process on a tantalum and oxygen containing layer disposed on a first surface of a substrate through a patterned mask layer in a plasma etch chamber, directing a first radiation source having a first wavelength from about 200 nm and about 800 nm from the first surface of the substrate to an area uncovered by the patterned mask layer, collecting a first optical signal reflected from the area covered by the patterned mask layer to obtain a first waveform from the reflected first optical signal, analyzing a first waveform obtained the reflected first optical signal reflected from the first surface of the substrate from a first time point to a second time point, determining a first endpoint of the etching process when a slope of the waveform is changed about 5 percent or greater from the first time point to the second time point, continuing etching a tantalum containing and oxygen free layer disposed between the tantalum containing and oxygen free layer and substrate, directing a second radiation source having a second wavelength from about 200 nm and about 800 nm from the first surface of the substrate to an area uncovered by the patterned mask layer and the etched tantalum containing and oxygen free layer, collecting a second optical signal reflected from the area covered by the patterned mask layer and the etched tantalum and oxygen containing layer to obtain a second waveform from the reflected second optical signal, analyzing a second waveform obtained the reflected second optical signal reflected from the first surface of the substrate from a third time point to a fourth time point, and determining a second endpoint of the etching process when a slope of the waveform is changed about 5 percent or greater from the third time point to the fourth time point.

In yet another embodiment, a method of determining an etching endpoint of a tantalum containing layer disposed on a substrate during an etching process includes performing an etching process on a tantalum and oxygen containing layer disposed on a first surface of a substrate through a patterned mask layer in a plasma etch chamber, directing a first radiation source having a first wavelength from about 220 nm from the first surface of the substrate to an area uncovered by the patterned mask layer, collecting a first optical signal reflected from the area covered by the patterned mask layer to obtain a first waveform from the reflected first optical signal, analyzing a first waveform obtained the reflected first optical signal reflected from the first surface of the substrate, determining a first endpoint of the etching process when the reflected first optical signal becomes saturated, continuing etching a tantalum containing and oxygen free layer disposed between the tantalum containing and oxygen free layer and substrate, directing a second radiation source having a second wavelength about 230 nm from the first surface of the substrate to an area uncovered by the patterned mask layer and the etched tantalum containing and oxygen free layer, collecting a second optical signal reflected from the area covered by the patterned mask layer and the etched tantalum and oxygen containing layer to obtain a second waveform from the reflected second optical signal, analyzing a second waveform obtained the reflected second optical signal reflected from the first surface of the substrate, and determining a second endpoint of the etching process when the reflected second optical signal becomes saturated.

BRIEF DESCRIPTION OF THE DRAWINGS

So that the manner in which the above recited features, advantages and objects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention provides a method and apparatus for etching a photomask substrate with enhanced process monitoring, for example, by providing for optical monitoring at certain regions of the photomask to obtain desired etch rate or endpoint determination. Although the discussions and illustrative examples focus on the etching rate detection and process endpoint determination during an etching process of an anti-reflective coating layer and an absorber layer disposed on a photomask substrate, various embodiments of the invention can also be adapted for process monitoring of other suitable substrates, including transparent or dielectric substrates, or optical disks.

Figure 1:
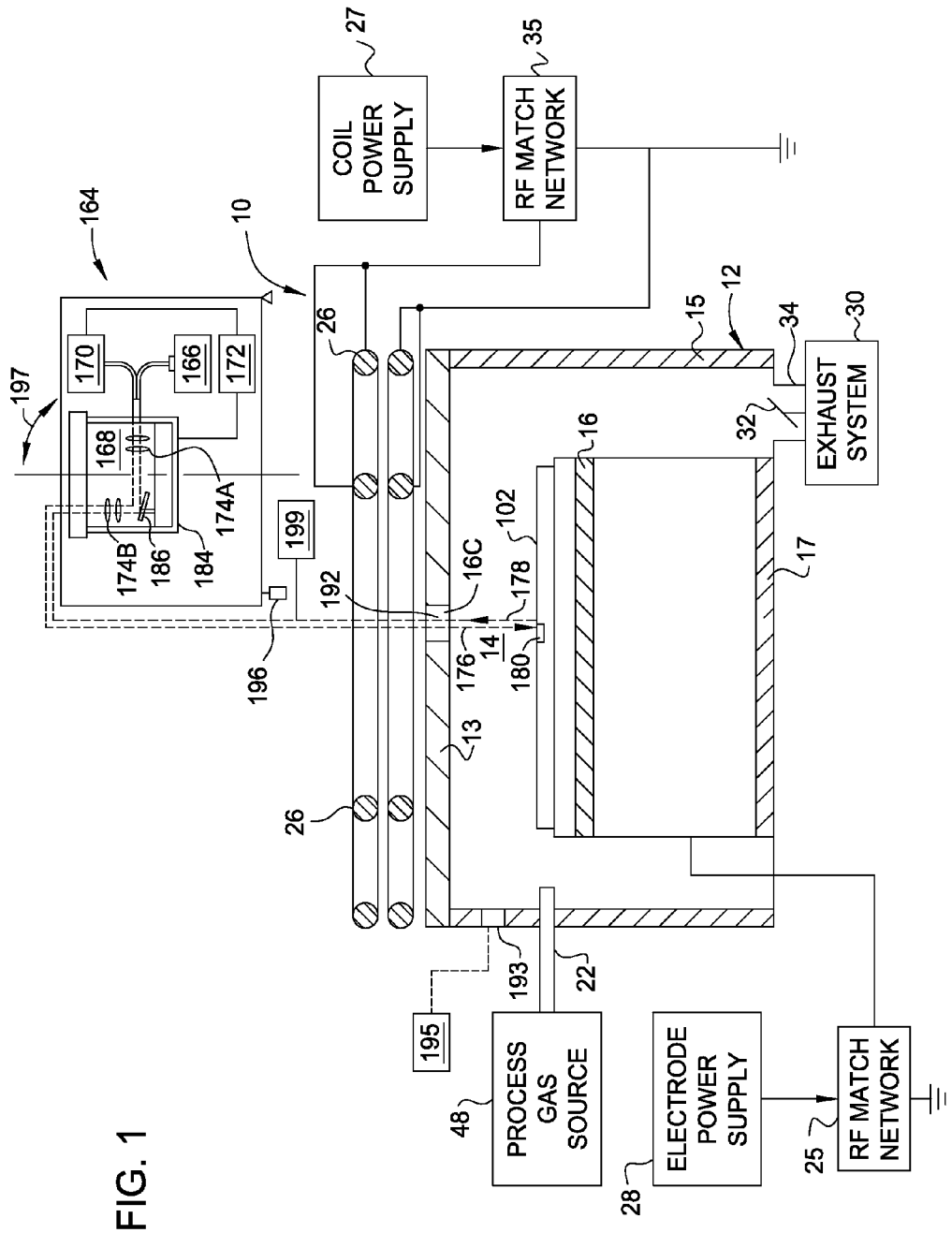
FIG. 1 illustrates a etch chamber incorporating one embodiment of the present invention.

FIG. 1 is a schematic cross sectional view of a plasma etch chamber 10 in accordance with one embodiment of the invention. Suitable plasma etch chambers that may be adapted to practice the invention include the Tetra™ II photomask etch chamber or the Decoupled Plasma Source (DPS™) chamber available from Applied Materials, Inc., of Santa Clara, Calif. Other suitably adapted process chambers may also be used in connection with embodiments of the invention, including, for example, capacitive coupled parallel plate chambers and magnetically enhanced ion etch chambers, as well as inductively coupled plasma etch chambers of different designs. The particular embodiment of the etch chamber 10 shown herein is provided for illustrative purposes and should not be used to limit the scope of the invention. It is contemplated that the invention may be utilized in other processing systems, including those from other manufacturers.

The etch chamber 10 generally includes a cylindrical sidewall or chamber body 12, an energy transparent chamber lid 13 mounted on the body 12, and a chamber bottom 17. The chamber lid 13 may be flat, rectangular, arcuate, conical, dome or multi-radius shaped. At least one inductive coil 26 is disposed above at least a portion of the chamber lid 13. In the embodiment depicted in FIG. 1, two concentric coils 26 are shown. The chamber body 12 and the chamber bottom 17 of the etch chamber 10 can be made of a metal, such as anodized aluminum, and the chamber lid 13 can be made of an energy transparent material such as a ceramic or other dielectric material.

A substrate support member 16 is disposed in the etch chamber 10 to support a substrate 102 during processing. The support member 16 may be a conventional mechanical or electrostatic chuck with at least a portion of the support member 16 being electrically conductive and capable of serving as a process bias cathode. While not shown, a photomask adapter may be used to secure the photomask on the support member 16. The photomask adapter generally includes a lower portion configured to cover an upper portion of the support member and a top portion having an opening that is sized and shaped to hold a photomask. In one embodiment, the top portion of the photomask adapter has a square opening. A suitable photomask adapter is disclosed in U.S. Pat. No. 6,251,217, issued on Jun. 26, 2001, which is incorporated herein by reference.

Process gases are introduced into the etch chamber 10 from a process gas source 48 through a gas distributor 22 peripherally disposed about the support member 16 and/or disposed in the chamber lid 13. Mass flow controllers (not shown) for each process gas, or alternatively, for mixtures of the process gas, are disposed between the etch chamber 10 and the process gas source 48 to regulate the respective flow rates of the process gases.

A plasma zone 14 is defined in the etch chamber 10 between the substrate support member 16 and the chamber lid 13. A plasma is generated in the plasma zone 14 from the process gases by supplying power from a power supply 27 to the inductive coils 26 through an RF match network 35. The support member 16 may include an electrode disposed therein, which is powered by an electrode power supply 28 and generates a capacitive electric field in the etch chamber 10 through an RF match network 25. Typically, RF power is applied to the electrode in the support member 16 while the body 12 is electrically grounded. The capacitive electric field, which is transverse to the plane of the support member 16, influences the directionality of charged species to provide more anisotropic etching of the substrate 102.

Process gases and etchant byproducts are exhausted from the etch chamber 10 through an exhaust port 34 to an exhaust system 30. The exhaust port 34 may be disposed in the bottom 17 of the etch chamber 10 or may be disposed in the body 12 of the etch chamber 10 for removal of process gases. A throttle valve 32 is provided in the exhaust port 34 for controlling the pressure in the etch chamber 10.

In one embodiment, an etch rate (i.e., endpoint) detection system 164 operatively coupled to the etch chamber 10. At least one optical access ports or viewports, are provided in different regions of the substrate support member 16, lid 13 and/or chamber body 12. In the example shown in FIG. 1, the optical access port comprises respectively a window 192 at a central region 16C of the chamber lid 13. The endpoint detection system 164 is configured to detect optical signals through the window 192. It is noted that more than one window may be formed in the chamber lid 13 or other locations of the etch chamber 10 which allows optical monitoring of various locations on a photomask substrate 102 from its surface during etching. Alternatively, different numbers of windows may be provided at other locations of the lid 13, chamber body 12 and/or substrate support member 16 as needed. For example, a side window 193 may be formed on the chamber wall 15 having a second etch rate detection system 195 coupled thereto to facilitate etch rate determination process. A camera 199 may be disposed adjacent to the etch rate detection system 164 to assist viewing the substrate 102 through the same optical view port as the endpoint detection system 164 so as to confirm that the radiation from the etch rate detection system 164 is directed to a correct location on the substrate surface for detection.

In general, a larger window facilitates the installation of optical components. However, the size of the window, especially in the central region 16C of the chamber lid 13, is selected to be sufficiently large for optical monitoring, yet small enough to avoid potential adverse impact for the RF interference. Selecting a small window also improves the lateral temperature uniformity of the chamber lid 13. The optical access port may generally comprise a flat window made of quartz or other materials that transmit light over a broad wavelength spectrum and resist plasma etching. A more detailed discussion of different optical configurations will be provided further below.

The endpoint detection system 164 comprises optical setup for operating in at least one of reflection, interferometry or transmission modes, and is configured for different types of measurements such as reflectance or transmittance, interferometry, or optical emission spectroscopy. Depending on the application of interest, e.g., the material layers or substrate structure being processed, endpoints may be detected based on a change in the reflectance or transmittance intensities, the number of interference fringes, or changes in optical emission intensities at specific wavelengths, or a combination thereof. In one particular embodiment depicted therein, the endpoint detection system 164 is configured to detect a process endpoint based on a change in the reflectance reflected from an etched substrate surface.

The reflection mode of operation allows reflectance (or reflectometry) and interferometric measurement to be performed. The endpoint detection system 164 generally comprises a light source 166, a focusing assembly 168 for focusing an incident optical beam 176 from the light source 166 onto a discreet area (spot) 180 on the surface of substrate 102, and a photodetector 170 for measuring the intensity of a reflected optical beam 178 reflected off the spot 180 of the substrate 102. Any adjustment mechanism 196 may be provided to set an angle of incidence 197 of the beam 176 so that the spot 180 may be selectively located on a desired location on the substrate 102. The adjustment mechanism 196 may be an actuator, set screw or other device suitable for setting the angle of incidence 197 by moving (tilting) the endpoint detection system 164 itself or a component therein, such as with an optical beam positioned 184, further discussed below. The photodetector 170 may be a single wavelength or multi-wavelength detector, or a spectrometer. Based on the measured signal of the reflected optical beam 178, a computer system 172 calculates portions of the real-time waveform and compares it with a stored characteristic waveform pattern to extract information relating to the etch process. In one embodiment, the calculation may be based on slope changes or other characteristic changes in the detected signals, either in reflection or transmission mode, for example, when a film is etched to a target depth. Alternatively, the calculation may be based on interferometric signals as the depth of a trench or the thickness of a film changes during etching. In other embodiments, more detailed calculations may be performed based on interferometric signals obtained over a wide spectrum in order to determine the depth or thickness at any point in the etch process to determine etch rate of the object being etched.

The light source 166 may be monochromatic, polychromatic, white light, or other suitable light source. In general, the optical signal from the reflected optical beam 178 may be analyzed to extract information regarding the presence or absence of a layer (e.g., an anti-reflective coating layer or an absorber layer), or the thickness of certain material layers within the spot 180. The intensity of the incident optical beam 176 is selected to be sufficiently high to provide a reflected optical beam 178 with a measurable intensity. The lamp can also be switched on and off to subtract background light. In one embodiment, the light source 166 provides polychromatic light, e.g., from an Hg—Cd lamp, an arc lamp, or a light emitting diode (LED) or LED array, which generate light in wavelength ranges from about 170 nm to about 800 nm, or about 200 to 800 nm, for example about 250 nm to about 800 nm respectively. The polychromatic light source 166 can be filtered to provide an incident optical beam 176 having selected frequencies. Color filters can be placed in front of the photodetector 170 to filter out all wavelengths except for the desired wavelength of light, prior to measuring the intensity of the reflected optical beam 178 entering the photodetector 170. The light can be analyzed by a spectrometer (array detector with a wavelength-dispersive element) to provide data over a wide wavelength range, such as ultraviolet to visible, from about 200 nm to 800 nm. The light source 166 can also comprise a flash lamp, e.g., a Xe or other halogen lamp, or a monochromatic light source that provides optical emission at a selected wavelength, for example, a He—Ne or ND-YAG laser. The light source may be configured to operate in a continuous or pulsed mode. Alternatively, the wavelength range may be expanded into the deep UV as low as 170 nm or beyond using optical materials with stable deep UV transmission and purging air paths with inert gas or other suitable carrier gas, such as nitrogen gas.

One or more convex focusing lenses 174A, 174B may be used to focus the incident optical beam 176 to the spot 180 on the substrate surface, and to focus the reflected optical beam 178 back on the active surface of photodetector 170. The spot 180 should be sufficiently large to compensate for variations in surface topography of the substrate 102 and device design features. This enables detection of etch endpoints for high aspect ratio features having small openings, such as vias or deep narrow trenches, which may be densely present or more isolated. The area of the reflected optical beam 178 should be sufficiently large to activate a large portion of the active light-detecting surface of the photodetector 170. The incident and reflected optical beams 176, 178 are directed through the transparent window 192 in the etch chamber 10 that allows the optical beams to pass in and out of the processing environment.

The diameter of the beam spot 180 is generally about 2 mm to about 10 mm. However, if the beam spot 180 encompasses large isolated areas of the substrate 102 containing only a small number of etched features, it may be necessary to use a larger beam spot in order to encompass a greater number of etched features. The size of the beam spot can therefore be optimized, depending on the design features for a particular device. If the signal is sufficient, a large beam spot or field of view will enable process control without precisely matching the position of the substrate support hole and the etched area of the substrate giving rise to the signal.

Optionally, the optical beam positioner 184 may be used to move the incident optical beam 176 across the substrate 102 to locate a suitable portion of the substrate surface on which to position the beam spot 180 to monitor an etching process. The optical beam positioner 184 may include one or more primary mirrors 186 that rotate at small angles to deflect the optical beam from the light source 166 onto different positions of the substrate surface. Additional secondary mirrors may be used (not shown) to direct the reflected optical beam 178 on the photodetector 170. The optical beam positioner 184 may also be used to scan the optical beam in a raster pattern across the surface of the substrate 102. In this embodiment, the optical beam positioner 184 comprises a scanning assembly consisting of a movable stage (not shown), upon which the light source 166, the focusing assembly 168 and the photodetector 170 are mounted. The movable stage can be moved through set intervals by a drive mechanism, such as a stepper motor or galvanometer, to scan the beam spot 180 across the substrate 102.

The photodetector 170 comprises a light-sensitive electronic component, such as a photovoltaic cell, photodiode, phototransistor, or photomultiplier, which provides a signal in response to a measured intensity of the reflected optical beam 178. The signal can be in the form of a change in the level of a current passing through an electrical component or a change in a voltage applied across an electrical component. The photodetector 170 can also comprise a spectrometer (array detector with a wavelength-dispersive element) to provide data over a wide wavelength range, such as ultraviolet to visible, from about 170 nm to 800 nm. The reflected optical beam 178 undergoes constructive and/or destructive interference which increases or decreases the intensity of the optical beam, and the photodetector 170 provides an electrical output signal in relation to the measured intensity of the reflected optical beam 178. The electrical output signal is plotted as a function of time to provide a spectrum having numerous waveform patterns corresponding to the varying intensity of the reflected optical beam 178.

In another embodiment, a plasma signal, e.g., plasma emission generated in the plasma zone, may also be collected for detection as needed for different process requirements.

A computer program on a computer system 172 analyzes the shape of the measured waveform pattern of the reflected optical beam 178 to determine the endpoint of the etching process. The waveform generally has a sinusoidal-like oscillating shape, with the trough of each wavelength occurring when the depth of the etched feature causes the return signal to be 180 degrees out of phase with the return signal reflected by the overlaying layer. The endpoint may be determined by calculating the etch rate using the measured waveform, phase information of the measured waveform and/or comparison of the measured waveform to a reference waveform. As such, the period of the interference signal may be used to calculate the depth and etch rate. The program may also operate on the measured waveform to detect a characteristic waveform, such as, an inflection point indicative of a phase difference between light reflected from different layers. The operations can be simple mathematic operations, such as evaluating a moving derivative to detect an inflection point.

Figure 2:
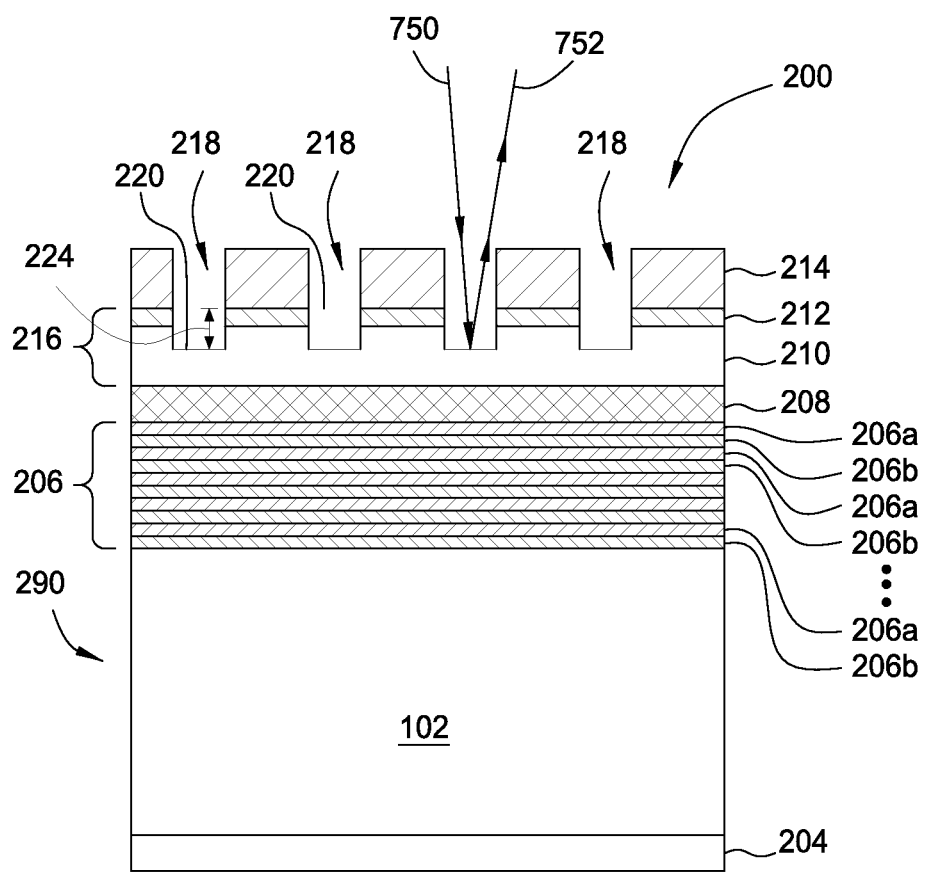
FIG. 2 illustrates schematically structures of one embodiment of the photomasks during fabrication.

FIG. 2 shows a photomask substrate 102 with a film stack 200 disposed thereon for etching that may be monitored by different etch rate detection techniques of the present invention. The film stack 200 disposed on the photomask substrate 102 that may be utilized to form desired features (i.e., openings 218) in the film stack 200. As the exemplary embodiment depicted in FIG. 2, the photomask substrate 102 may be a quartz substrate or a special low thermal expansion glass substrate. The photomask substrate 102 has a rectangular shape having sides between about 5 inches to about 9 inches in length. The photomask substrate 102 may be between about 0.15 inches and about 0.25 inches thick. In one embodiment, the photomask substrate 102 is about 0.25 inches thick. An optional chromium containing layer 204, such as a chromium nitride (CrN) layer may be disposed to a backside of the photomask substrate 102 as needed.

An EUV reflective multi-material layer 206 is disposed on the photomask substrate 102. The reflective multi-material layer 206 may include at least one molybdenum layer 206a and a silicon layer 206b. Although the embodiment depicted in FIG. 2 shows five pairs of molybdenum layer 206a and silicon layer 206b (alternating molybdenum layers 206a and the silicon layers 206b repeatedly formed on the photomask substrate 102), it is noted that number of molybdenum layers 206a and the silicon layers 206b may be varied based on different process needs. In one particular embodiment, forty pairs of molybdenum layers 206a and the silicon layers 206b may be deposited to form the reflective multi-material layer 206. In one embodiment, the thickness of each single molybdenum layer 206a may be controlled at between about 10 Å and about 100 Å, such as about 30 Å, and the thickness of the each single silicon layer 106b may be controlled at between about 10 Å and about 100 Å, such as about 40 Å. The reflective multi-material layer 206 may have a total thickness between about 100 Å and about 5000 Å. The reflective multi-material layer 206 may have an EUV light reflectivity of up to 70% at 13.5 nm wavelength. The reflective multi-material layer 206 may have a total thickness between about 70 nm and about 140 nm.

Subsequently, a capping layer 208 is disposed on the reflective multi-material layer 206. The capping layer 208 may be fabricated by a metallic material, such as ruthenium (Ru) material, zirconium (Zr) material, or any other suitable material. In the embodiment depicted in FIG. 2, the capping layer 208 is a ruthenium (Ru) layer. The capping layer 208 has a thickness between about 1 nm and about 10 nm.

An absorber layer 216 may then be disposed on the capping layer 208. The absorber layer 216 is an opaque and light-shielding layer configured to absorb portion of the light generated during the lithography process. The absorber layer 216 may be in form of a single layer or a multi-layer structure, such as including an antireflective coating layer 212 disposed on a bulk absorber layer 210, as the embodiments depicted in FIG. 2. In one embodiment, the absorber layer 216 has a total film thickness between about 50 nm and about 200 nm. The total thickness of the absorber layer 216 advantageously facilitates meeting the strict overall etch profile tolerance for EUV masks in sub-45 nm technology node applications.

In one embodiment, the bulk absorber layer 210 may comprise tantalum-based materials with essentially no oxygen, for example tantalum silicide based materials, such as TaSi, nitrogenized tantalum boride-based materials, such as TaBN, and tantalum nitride-based materials, such as TaN. The antireflective coating layer 212 may be fabricated from a tantalum and oxygen-based materials. The composition of the antireflective coating layer 212 corresponds to the composition of the bulk absorber layer 210 and may comprise oxidized and nitrogenized tantalum and silicon based materials, such as TaSiON, when the bulk absorber layer 210 comprises TaSi or TaSiN; tantalum boron oxide based materials, such as TaBO, when the bulk absorber layer 210 comprises TaBN; and oxidized and nitrogenized tantalum-based materials, such as TaON, when the bulk absorber layer 210 comprises TaN. The antireflective coating layer 212 can also comprise TaO.

A patterned photoresist layer 214 is then formed over the absorber layer 216 having openings 218 formed therein that expose portions 220 of the absorber layer 216 for etching. The photoresist layer 214 may comprise any suitable photosensitive resist materials, such as an e-beam resist (for example, a chemically amplified resist (CAR)), and deposited and patterned in any suitable manner. The photoresist layer may be deposited to a thickness between about 100 nm and about 1000 nm.

The photomask substrate 102 is readily to be transferred to an etching processing chamber, such as the etch reactor 100 depicted with referenced to FIG. 1, to perform an etching process. The embodiment depicted in FIG. 2 shows a portion 224 of the absorber layer 216 has been etched away and the endpoint detection system 164 is turned on during the etching process to monitor the etching progress to determine a proper etching process endpoint, which will be discussed in detail further below with referenced to FIGS. 3-4B. The etching process is performed to etch the absorber layer 216 and the capping layer 208 exposed through the opening 218 defined by the photoresist layer 214. The etching process is performed to etch the absorber layer 216 and the capping layer 208 until the underlying surface of the reflective multi-material layer 206 is exposed. The antireflective coating layer 212 and the bulk absorber layer 210 may be continuously etched using one process step, such as a single etchant chemistry, or separately etched by multiple steps in one or different etching processes as needed. The patterns from the photoresist layer 214 are then transferred into the absorber layer 216 through the etching process.

Subsequently, a reflective multi-material layer etching process is performed to etch the reflective multi-material layer 206. The reflective multi-material etching process uses an etching gas mixture configured to etch the reflective multi-material layer 206 until a desired depth of the reflective multi-material layer 206 is removed, or the underlying photomask substrate 102 is exposed. As the reflective multi-material layer 206 may include more than one types of the materials, the etching gas mixture as selected is configured to have high etching capability to etch different materials as well as maintaining high selectivity to the upper capping layer 208 and the absorber layer 216 so as to maintain desired sidewall profiles to complete the photomask manufacture process.

Figure 3:
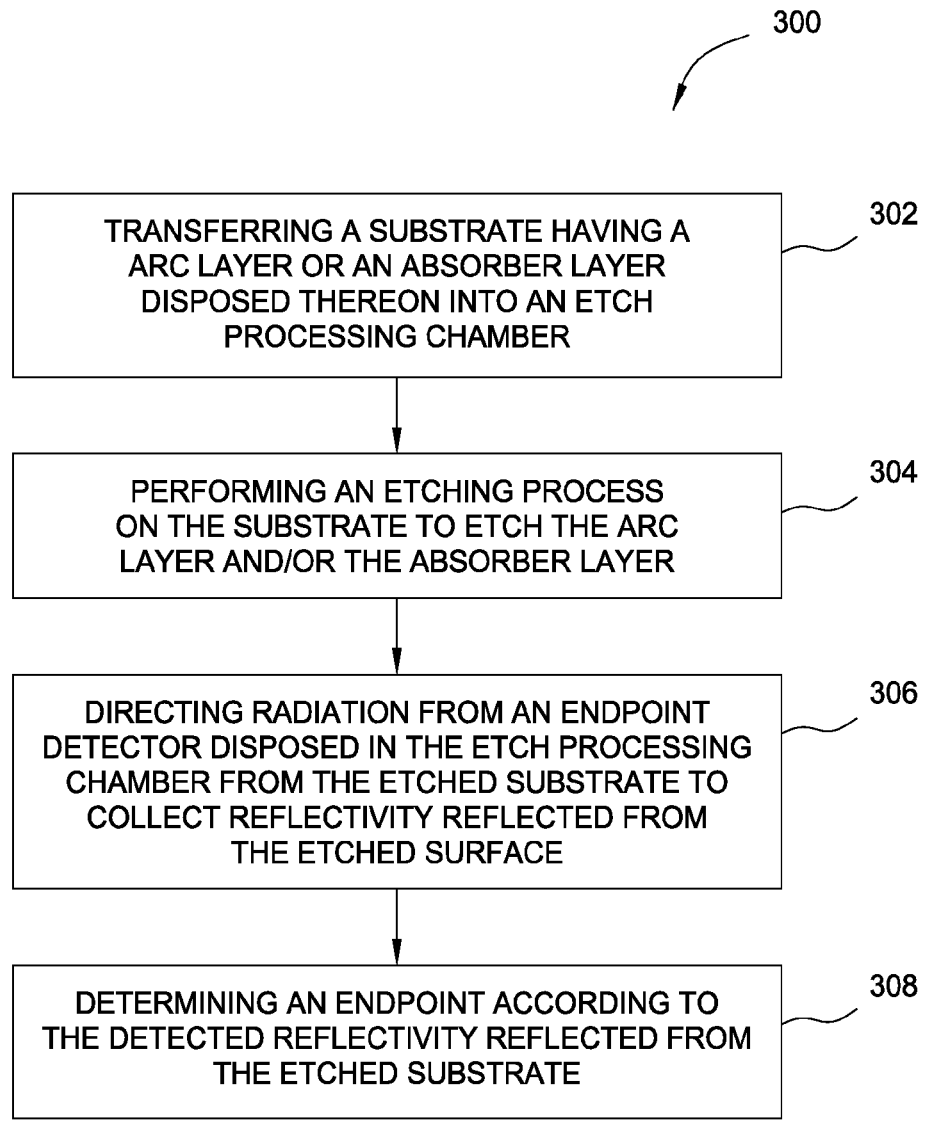
FIG. 3 illustrates a flow diagram regarding an endpoint determination process during fabrication process depicted in FIG. 2.

FIG. 3 is a flow diagram of one embodiment of a method 300 for etching an absorber layer formed in a film stack disposed on a photomask, such as the absorber layer 216 formed in the film stack 200 depicted in FIG. 2, and determining an etching process endpoint for etching the absorber layer 216. Although the method 300 is described below with reference to a substrate utilized to fabricate a photomask, the method 300 may also be used to advantage in other photomask etching or any etching applications.

The method 300 begins at block 302 when the photomask substrate 102 is transferred to and placed on a substrate support member disposed in an etch reactor, such as the etching chamber depicted in FIG. 1. As described above, the photomask substrate 102 includes an optically transparent silicon based material, such as quartz or low thermal expansion glass layer having the absorber layer 216 disposed thereon having portions 222 of absorber layer 216 exposed by the patterned photoresist layer 214 readily for etching.

At block 304, an etching process is performed to etch the absorber layer 216 disposed on the substrate 102. The patterned photoresist layer 214 may serve as a mask layer to protect some portion of the absorber layer 216 from being etched during the absorber layer etching process. The etching process endpoint detection for etching the absorber layer 216 can be monitored either in reflection or transmission mode, and reflectance, transmittance and/or interferometric signals can be performed. In one particular embodiment depicted therein, the process endpoint detection for etching the absorber layer 216 is monitored in reflection mode.

In one embodiment, halogen-containing gases are typically used for etching different materials found on the film stack 200 of the photomask structure. For example, a process gas containing chlorine may be used for etching an absorber layer (e.g., a tantalum containing layer). Alternatively, a fluorine-containing gas such as trifluoromethane ($CHF_3$) or tetrafluoromethane ($CF_4$) may also be used for etching quartz. In one embodiment, a fluorine-containing gas such as trifluoromethane ($CHF_3$) or tetrafluoromethane ($CF_4$) is often used to etch a TaO or TaBO antireflection layer while more selective chlorine and oxygen gas combinations are used to etch the TaN or TaBN absorber layer.

At block 306, while etching the absorber layer 216, an incident optical beam 750 from the endpoint detection system 164 is directed to the etched substrate surface. The incident optical beam 750, as shown in FIG. 2, from the etch rate detection system 164 is directed, through one of the windows in the chamber lid, onto one or more areas of the photomask substrate 102. The incident optical beam 750 is configured to be directed to the opening 218, such as open areas where the absorber layer 216 is exposed by the patterned photoresist layer 214 to be etched to form trenches, vias, and apertures for the film stack 200 as needed. Alternatively, the plasma itself may be used as the light source.

A return beam 752, e.g., reflecting off the surface of etched absorber layer 216 within the openings 218 being etched and exposed, is detected by the photodetector 170 of the etch rate detection system 164. Alternatively, the return beam may be plasma light reflected off the photomask at the directed areas. During etching of the absorber layer 216, the intensity of the reflected optical beam 752 changes overtime. The time-varying intensity of the reflected optical beam 752 at a particular wavelength is then analyzed to determine at least one of the depth etched, the etch rate and the end point of the absorber layer etching process.

Figure 4A:
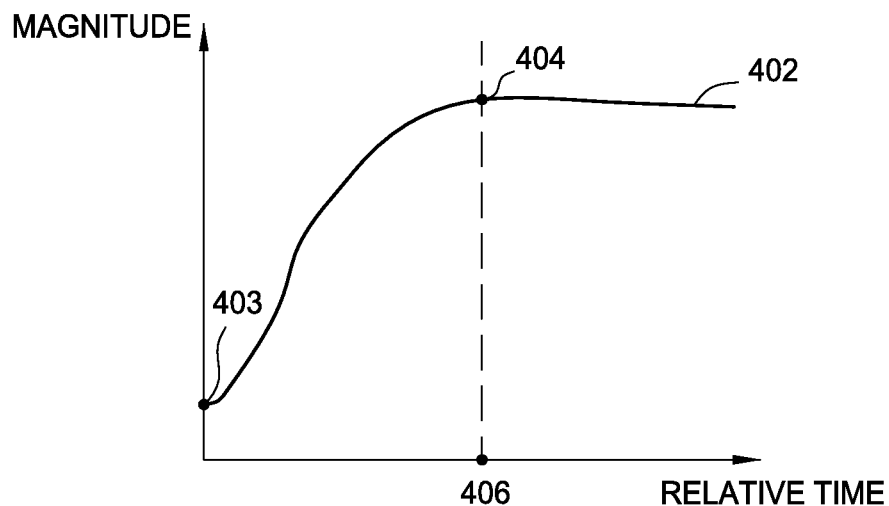
FIG. 4A illustrates one embodiment of optical signals detected for etch rate determination for etching an antireflective coating layer.

At block 308, an etching process endpoint is determined by analyzing the waveform obtained from the detected reflected optical beam 752 reflected from the surface of the etched substrate. In the embodiment wherein the absorber layer 206 is a composite layer having the antireflective coating layer 212 disposed on the bulk absorber layer 210, the reflected optical beam 752 initially detected is for etching the antireflective coating layer 212. After the antireflective coating layer 212 is etched away, the reflected optical beam 752 may be continued to be collected for determination of the endpoint of etching the bulk absorber layer 210. The endpoint detection process may be split into a two step process using two different wavelengths, or the endpoint detection process may be continuously performed using the same wavelength for detection until the whole bulk absorber layer 210 is etched away, exposing the underlying capping layer 208. FIG. 4A depicts one embodiment of optical signals as detected for etch rate determination for etching the antireflective coating layer 212 at a light wavelength at between about 200 nm and about 230 nm from the light source 166. The optical signal 402, as shown in FIG. 4A, is plotted as a function of time to provide a waveform pattern corresponding to the varying intensity of the reflected optical beam 752 over time. The waveform pattern will be different at other wavelengths. Collecting a spectrum of wavelengths will provide numerous waveform patterns. The optical signal 402 is detected real-time when a production substrate is etched in the etch reactor. In the embodiment depicted in FIG. 4A, the intensity of the reflected optical beam 752 is gradually increasing as the underlying bulk absorber layer 210 is gradually exposing. When the antireflective coating layer 212 is gradually etched away, the intensity of the reflected optical beam 752 is gradually increasing until getting saturated. When the intensity of the reflected optical beam 752 is saturated and steady at a stable value 404 at a time point 406, it indicates the antireflective coating layer 212 has been etched away, exposing the underlying bulk absorber layer 210, thereby determining the time point 406 is the proper endpoint for etching away the antireflective coating layer 212.

In one embodiment, an endpoint for etching the antireflective coating layer 212 may be determined when the intensity of the reflected optical beam 752 as detected is between about 1 percent and about 20 percent, such as between about 4 percent to 12 percent, for example about 5 percent or 10 percent, increased from the initial detected reflected optical beam 752 collected in a beginning time point 403 of the detection process. In another embodiment, the endpoint for etching the antireflective coating layer 212 may be determined when the slope of the optical signal 402 is initially small, then rising by at least two times, then becoming small. In other word, the endpoint for etching the antireflective coating layer 212 is changed about 100 percent from the original detected slope. In yet another embodiment, the endpoint for etching the antireflective coating layer 212 may be determined when the optical signal 402 has become saturated and remains in a steady state for about over than 3 seconds. In an exemplary embodiment wherein a light source of about 230 nm wavelength is utilized to detect the endpoint for etching the antireflective coating layer 212, the process endpoint occurred at time point 406 is between about 10 seconds and about 25 seconds.

Figure 4B:
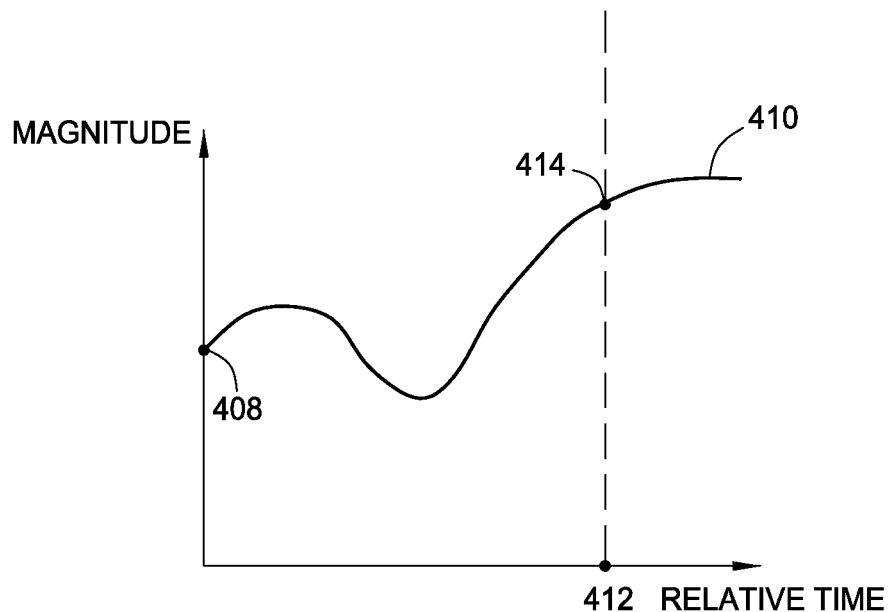
FIG. 4B illustrates one embodiment of optical signals detected for etch rate determination for etching an bulk absorber layer.

FIG. 4B depicts one embodiment of the optical signal 752 as detected for etch rate determination for etching the bulk absorber layer 210 at a light wavelength at between about 200 nm and about 800 nm, such as between about 200 nm and about 240 nm, from the light source 166 or the plasma source. The optical signal 410, as shown in FIG. 4B, is plotted as a function of time to provide a waveform pattern corresponding to the varying intensity of the reflected optical beam 752 over time when etching the bulk absorber layer 210. In the embodiment depicted in FIG. 4B, the intensity of the reflected optical beam 752 is initially low and somewhat decreasing, and then gradually increases as the bulk absorber layer 210 is gradually etched away. When the bulk absorber layer 210 is gradually etched away exposing the underlying capping layer 208, the intensity of the reflected optical beam 752 is gradually increasing until getting saturated and becoming constant. When the intensity of the reflected optical beam 752 is saturated and steady at a stable value 414 at a time point 412, it indicates the bulk absorber layer 210 has been substantially etched away, exposing the underlying capping layer 208, thereby determining the time point 412 is the proper endpoint for etching away the antireflective coating layer 212. As the bulk absorber layer 210 is gradually etched away to expose the underlying capping layer 208, since the underlying capping layer 208 has a reflective surface, the reflectivity as detected raises when the underlying capping layer 208 is gradually exposing. The endpoint is then reached when the reflectivity raises and becomes constant.

In one embodiment, an endpoint for etching the bulk absorber layer 210 may be determined when the intensity of the reflected optical beam 752 as detected is about 5 percent or greater increased from the initial detected reflected optical beam 752 collected from a beginning time point 408 of the detection process. In another embodiment, the endpoint for etching the bulk absorber layer 210 may be determined when the slope of the optical signal 410 is about 0.01 per 10 seconds, changing from about 0.23 to about 0.24 (plasma source). In other word, the endpoint for etching the antireflective coating layer 212 is changed about 5 percent or greater from the original detected slope. In yet another embodiment, the endpoint for etching the bulk absorber layer 210 may be determined when the optical signal 410 has become saturated and remains in a steady state (or no longer increasing) for about more than 10 seconds. In an exemplary embodiment wherein a light source of about 220 nm wavelength is utilized to detect the endpoint for etching bulk absorber layer 210, the process endpoint occurred at time point 412 is between about 25 seconds and about 175 seconds.

By monitoring reflectivity of an optical beam reflected from an etched absorber layer (either an antireflective coating or a bulk absorber layer), such as a Ta containing material, at a predetermined wavelength, proper process endpoints may be obtained by analyzing waveforms obtained from the reflected optical beam reflected from an etched substrate surface. The embodiments of the present invention provide an improved apparatus and method with enhanced process monitoring and control capabilities. These improvements also allow reliable etch rate/loss of thickness and endpoint determination for absorber layer etching applications.

While the foregoing is directed to embodiments of the present invention, other and further embodiments of the invention may be devised without departing from the basic scope thereof, and the scope thereof is determined by the claims that follow.

What is claimed is:

1. A method of determining an etching endpoint of a tantalum containing layer disposed on a substrate during an etching process, comprising:
    performing an etching process on a tantalum and oxygen containing layer disposed on a first surface of a substrate through a patterned mask layer in a plasma etch chamber;
    directing a first radiation source having a first wavelength from about 200 nm and about 800 nm from the first surface of the substrate to an area uncovered by the patterned mask layer;
    collecting a first optical signal reflected from the area covered by the patterned mask layer to obtain a first waveform from the reflected first optical signal;
    analyzing a first waveform obtained the reflected first optical signal reflected from the first surface of the substrate from a first time point to a second time point;
    determining a first endpoint of the etching process when a slope of the waveform is changed about 5 percent or greater from the first time point to the second time point;
    continuing etching a tantalum containing and oxygen free layer disposed between the tantalum and oxygen containing layer and substrate;
    directing a second radiation source having a second wavelength from about 200 nm and about 800 nm from the first surface of the substrate to an area uncovered by the patterned mask layer and the etched tantalum containing and oxygen free layer;
    collecting a second optical signal reflected from the area covered by the patterned mask layer and the etched tantalum and oxygen containing layer to obtain a second waveform from the reflected second optical signal;
    analyzing a second waveform obtained the reflected second optical signal reflected from the first surface of the substrate from a third time point to a fourth time point; and
    determining a second endpoint of the etching process when a slope of the waveform is changed about 5 percent or greater from the third time point to the fourth time point.

2. The method of claim 1, wherein the tantalum containing and oxygen free layer is TaSi, a TaBN, or a TaN layer.

3. The method of claim 1, wherein the tantalum and oxygen containing layer is a TaSiON, a TaBO, or a TaON layer.

4. The method of claim 1, wherein the first wavelength is about 220 nm, and the second wavelength is about 230 nm.

5. The method of claim 1, wherein a reflective multi-material layer is disposed between the tantalum containing and oxygen free layer and the substrate.

6. The method of claim 5, wherein the reflective multi-material layer include at least one molybdenum layer and a silicon layer.

7. A method of determining an etching endpoint of a tantalum containing layer disposed on a substrate during an etching process, comprising:
    performing an etching process on a tantalum and oxygen containing layer disposed on a first surface of a substrate through a patterned mask layer in a plasma etch chamber;
    directing a first radiation source having a first wavelength from about 220 nm from the first surface of the substrate to an area uncovered by the patterned mask layer;
    collecting a first optical signal reflected from the area covered by the patterned mask layer to obtain a first waveform from the reflected first optical signal;
    analyzing a first waveform obtained the reflected first optical signal reflected from the first surface of the substrate;
    determining a first endpoint of the etching process when the reflected first optical signal becomes saturated;
    continuing etching a tantalum containing and oxygen free layer disposed between the tantalum and oxygen containing layer and substrate;
    directing a second radiation source having a second wavelength about 230 nm from the first surface of the substrate to an area uncovered by the patterned mask layer and the etched tantalum containing and oxygen free layer;
    collecting a second optical signal reflected from the area covered by the patterned mask layer and the etched tantalum and oxygen containing layer to obtain a second waveform from the reflected second optical signal;
    analyzing a second waveform obtained the reflected second optical signal reflected from the first surface of the substrate; and
    determining a second endpoint of the etching process when the reflected second optical signal becomes saturated.

* * * * *